(12) United States Patent
Micciche' et al.

(10) Patent No.: US 8,436,428 B2
(45) Date of Patent: May 7, 2013

(54) INTEGRATED COMMON SOURCE POWER MOSFET DEVICE, AND MANUFACTURING PROCESS THEREOF

(75) Inventors: Monica Micciche', Enna (IT); Antonio Giuseppe Grimaldi, S. Giovanni La Punta (IT); Claudio Adragna, Monza (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 12/978,749

(22) Filed: Dec. 27, 2010

(65) Prior Publication Data
US 2011/0156170 A1 Jun. 30, 2011

(30) Foreign Application Priority Data
Dec. 28, 2009 (IT) .............. TO2009A1047

(51) Int. Cl.
*H01L 27/088* (2006.01)
(52) U.S. Cl.
USPC ............... 257/401; 257/E21.409; 257/E27.06
(58) Field of Classification Search ............... None
See application file for complete search history.

(56) References Cited

U.S. PATENT DOCUMENTS

| 4,738,936 A | 4/1988 | Rice |
| 5,703,390 A * | 12/1997 | Itoh ............... 257/337 |
| 2004/0046202 A1 | 3/2004 | Nakayama et al. |
| 2005/0280101 A1 | 12/2005 | Babcock et al. |

FOREIGN PATENT DOCUMENTS

| EP | 1 011 146 A1 | 6/2000 |
| JP | 05-090579 | 4/1993 |

OTHER PUBLICATIONS

Italian Search Report dated Aug. 30, 2010 from corresponding Italian Application No. TO2009A001047.
Written Opinion dated Aug. 30, 2010 from corresponding Italian Application No. TO2009A001047.
Zhao, Q et al., *Design Considerations for a New Generation Mid-voltage Power MOSFET Technology*, IEEE 2005, pp. 336-342.
Farenc, D. et al., *Clamped Inductive Switching of LDMOST for Smart Power IC's*, Proceedings of 1998 International Symposium on Power Semiconductor Devices & Ics, Kyoto, 4 pages, XP-000801094.

* cited by examiner

*Primary Examiner* — Fei Fei Yeung Lopez
(74) *Attorney, Agent, or Firm* — Wolf, Greenfield & Sacks, P.C.

(57) ABSTRACT

An integrated power MOSFET device formed by a substrate); an epitaxial layer of N type; a sinker region of P type, extending through the epitaxial layer from the top surface and in electrical contact with the substrate; a body region, of P type, extending within the sinker region from the top surface; a source region, of N type, extending within the body region from the top surface, the source region delimiting a channel region; a gate region; a source contact, electrically connected to the body region and to the source region; a drain contact, electrically connected to the epitaxial layer; and a source metallization region, extending over the rear surface and electrically connected to the substrate and to the sinker region.

25 Claims, 10 Drawing Sheets

PRIOR ART

INTEGRATED COMMON SOURCE POWER MOSFET DEVICE, AND MANUFACTURING PROCESS THEREOF

CROSS REFERENCE TO RELATED APPLICATIONS

This application claims the priority benefit of Italian patent application number TO2009A001047, filed on Dec. 28, 2009, entitled "INTEGRATED COMMON SOURCE POWER MOSFET DEVICE, AND MANUFACTURING PROCESS THEREOF," which is hereby incorporated by reference to the maximum extent allowable by law.

BACKGROUND OF THE INVENTION

1. Field of the Invention

The present invention relates to an integrated common source power MOSFET device and to the manufacturing process thereof.

2. Discussion of the Related Art

As is known, power MOSFET devices are typically of a vertical current type, wherein the substrate forms the drain region, and the epitaxial layer accommodates a plurality of body regions arranged side by side, which in turn accommodate source regions. The body and source regions are shorted by a metallization. Gate regions are arranged, insulated, on the body of semiconductor material, generally between adjacent pairs of body regions.

With the above type of structure, it is possible to obtain one or more common drain MOSFET devices.

However, in some applications, pairs of power MOS transistors are used having source terminals connected together and with independent drain and gate terminals so that they can be independently driven. An application having this requirement is, for example, synchronous rectification on the secondary winding of LLC resonant converters, as discussed in detail hereinafter.

As is known, resonant converters are a vast class of switching converters characterized by the presence of a resonant circuit that actively participates in determining the input-output power flow. In these converters, a bridge (half-bridge), made up of four (two) power switches (typically N-channel MOSFETs) and supplied by a d.c. voltage, generates a square wave voltage, which is supplied to a resonant circuit tuned at the fundamental frequency of the square wave. In this way, on account of its selective characteristics, the resonant circuit responds mainly to the fundamental component and negligibly to the higher order harmonics. As a result, the circulating power can be modulated by varying the frequency of the square wave, and, according to the configuration of the resonant circuit, the currents and/or the voltages associated with the power flow have a sinusoidal or piecewise sinusoidal pattern.

Figure 26:
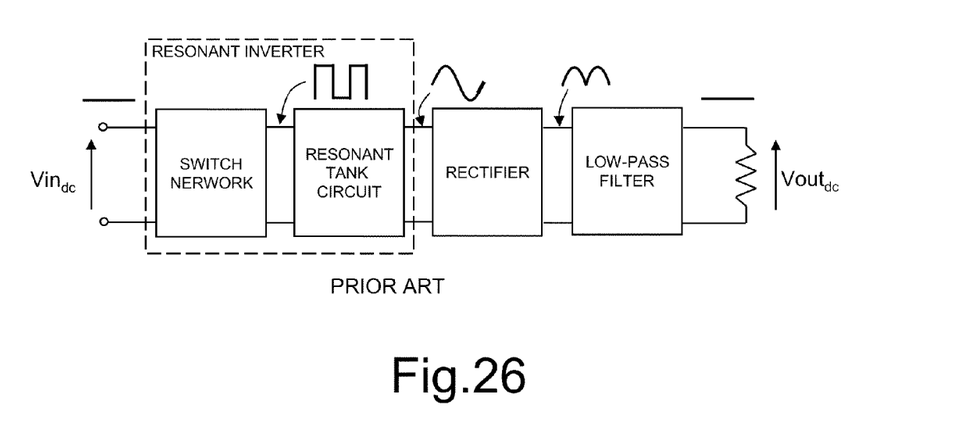
FIG. 26 shows a block diagram of a resonant converter of a known type.

The above voltages and/or currents are rectified and filtered so as to supply d.c. power on the load. In network applications, for reasons of safety standards, the rectification and filtering system that supplies the load is coupled to the resonant circuit through a transformer that provides the insulation between source and load, as required by the aforesaid standards. As in all insulated network converters, also in this case the approach is to refer to a primary side (in so far as it is connected to the primary winding of the transformer) connected to the input source, and a secondary side (in so far as it is connected to the secondary winding or windings of the transformer), which supplies power to the load through the rectification and filtering system. FIG. 26 shows a high level block diagram of a resonant converter of the type described.

Figure 27:
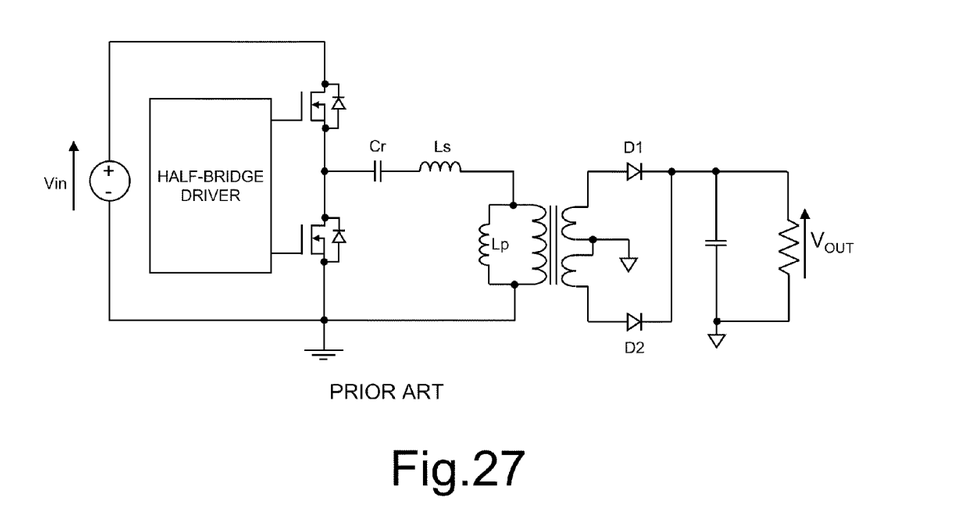
FIG. 27 shows a circuit diagram of an implementation of the resonant converter of FIG. 26.

Among the many types of resonant converters that can be built on the basis of the general architecture of FIG. 26 and are classified on the basis of the configuration of the resonant circuit that they use, the so called LLC resonant converter is encountering large popularity, especially in its half-bridge version (illustrated in FIG. 27). The name (LLC resonant converter) stems from the fact that the resonant circuit uses two induction coils (Ls and Lp) and a capacitor (Cr). For convenience, from now on reference will be made to the half-bridge version alone, but it is clear that the following can be applied entirely also to the bridge configuration.

LLC resonant converters are characterized by high conversion efficiency (it is possible to reach easily an efficiency higher than 95%), capacity for working at high frequencies, low generation of electromagnetic interference (EMI) and, finally, high power density (i.e., the capacity of obtaining conversion systems of reduced volume), characteristics to which a particular emphasis is given in many present day applications.

Typical examples of these applications are AC-DC adapters used in high-range PC notebooks or in PC desktops with reduced aspect ratio, and supply systems for network servers and for telecommunications apparatuses.

Notwithstanding the advantages of LLC resonant converters, in these, as in traditional switching converters, the maximum efficiency that can be achieved may be limited by the losses in the secondary rectifiers, which, in LLC resonant converters, represent the vast majority of losses.

It is known that, in order to significantly reduce the losses linked to the secondary rectification, it is possible to resort to the so-called "synchronous rectification" technique, wherein the rectifier diodes D1, D2 are replaced by MOSFETs having appropriately low dynamic resistance RDS(on) so that the voltage drop across the transistors is significantly lower than the drop across the diodes (with consequent reduction in conduction losses). Obviously, the MOSFETs are driven so as to be functionally equivalent to diodes.

Figure 28:
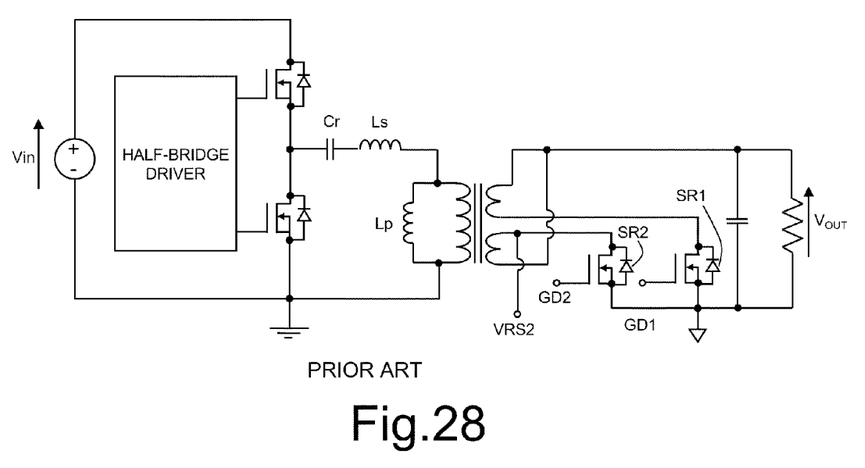
FIG. 28 shows a circuit diagram of a different implementation of the resonant converter of FIG. 26.

FIG. 28 illustrates an LLC resonant converter with secondary synchronous rectifiers (transistors SR1, SR2). As may be noted, the position of the transistors SR1, SR2 has been shifted with respect to that of the rectifier diodes D1, D2 in FIG. 27 in order to be able to drive the MOSFETs SR1, SR2 with respect to ground. From the functional standpoint, however, there is no difference.

Figure 29:
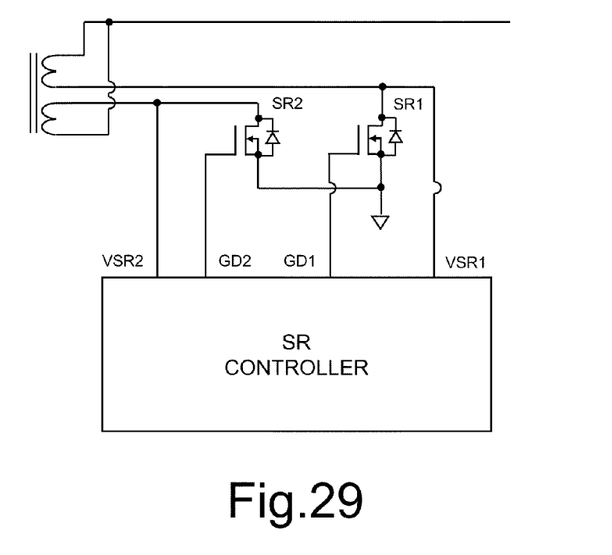
FIG. 29 shows the connection of the resonant converter of FIG. 28 to a control stage.

At the current state of the art, integrated control circuits on the market are specifically dedicated to driving synchronous rectifiers for LLC resonant converters, i.e., designed to supply the signals GD1, GD2 indicated in FIG. 28. Normally, these signals are generated by processing other signals, among which the drain-to-source voltages of the MOSFETs SR1, SR2, as illustrated in the block diagram of FIG. 29. In order to reproduce operation of the rectifiers D1, D2 of FIG. 27, the MOSFETs SR1 and SR2 are to be driven in phase opposition so that the respective drains are able to move independently.

Experience shows that the parasitic resistances and inductances of the circuit metallizations that comprise the MOSFETs SR1, SR2 (including those linked to the package of the MOSFETs themselves), as well as those of the connections between the pins of the control device and the drain terminals of the transistors SR1 and SR2 are particularly critical for proper generation of the signals GD1, GD2 and, thus, for proper operation of the synchronous-rectification system and of the entire converter.

In order to reduce these critical aspects, it would thus be desirable to be able to integrate the two transistors SR1, SR2 in the same package. However, with the low-voltage technologies used to obtain the integrated control circuit, the bottom surface of the silicon die corresponds to ground so that, with a conventional embodiment of the MOSFETs, three separate dice are necessary in a package with three insulated frames in order not to electrically connect the drain terminals to one another and to ground.

Similar problems are encountered in general in all the cases where it is necessary to have an array of open-drain MOSFETs with grounded source, that can be driven independently of one another, to be accommodated in a single package.

In fact, with the typical structure of MOSFETs (which have the bottom surface of the die corresponding to the drain terminal), current solutions require the use of a number n of silicon dice equal to the number of the MOSFETs, each of which is assembled on an own copper island insulated from a metallic standpoint from all the others so as to enable the drain terminals to move independently of one another. The difficulties of mechanical formation of a frame with n islands, as well as the cost of assemblage of n dice are an evident limitation of this approach.

In general, the integration of power MOS transistors in different dice, connected together, causes a very high gate-drain parasitic capacitance that generates problems of dissipation, which are critical in the case of devices operating at rather high frequencies (in the case of the resonant converters described above of the order of megahertz) and at high currents (of the order of some amps).

U.S. Pat. No. 4,738,936 describes a manufacturing process of lateral MOSFETs using the Mesa technique, including digging in the semiconductor body to obtain the body region. This solution sets, however, limits of scaling-down of the structures and thus limits the possibility of achieving high levels of performance.

SUMMARY OF THE INVENTION

An aim of the present invention is to obtain a common-source power MOSFET device that overcomes the drawbacks of the prior art.

According to at least one embodiment, there is provided an integrated power MOSFET device, comprising a substrate, an epitaxial layer of a first conductivity type, the epitaxial layer and the substrate defining a first surface and a second surface, respectively, a sinker region of a second conductivity type, extending through the epitaxial layer from the first surface and in electrical contact with the substrate, a body region of the second conductivity type, extending within the sinker region from the first surface, a source region of the first conductivity type, extending within the body region from the first surface, the source region delimiting a channel region within the body region and facing the first surface a gate region, extending over, and electrically insulated from, the first surface, above the channel region, a source contact, extending over the first surface and electrically connected to the body region and to the source region, a drain contact, extending over the first surface and electrically connected to the epitaxial layer; and a source metallization region, extending over the second surface and electrically connected to the substrate.

According to another embodiment, the sinker region extends as far as the substrate.

According to another embodiment, the integrated power MOSFET device comprises a trench extending from the first surface through the body region, the sinker region and part of the substrate, the trench being filled with metal material in direct electrical contact with the substrate and with the source electrode.

According to another embodiment, the integrated power MOSFET device comprises an edge structure including an edge region, of the second conductivity type, extending through the epitaxial layer from the first surface and in electrical contact with the substrate, the edge region delimiting an active area in the epitaxial layer housing the sinker region, the body region, and the source region.

According to another embodiment, the edge structure further comprises a semiconductor material region extending over, and electrically insulated from, the first surface, above the edge region, and an edge metallization extending over, and electrically connected to, the semiconductor material region, the device further comprising a gate metallization, extending over the first surface and electrically connected to the edge metallization, and a drain metallization, extending over the first surface on the entire active area, except at the gate metallization.

According to another embodiment, the gate region comprises at least one polysilicon line extending on the first surface from a first side of the semiconductor material region.

According to another embodiment, the gate region further comprises a gate finger extending on the first surface from a second side of the semiconductor material region, in a traverse direction with respect to the polysilicon line.

According to another embodiment, the integrated power MOSFET device comprises a stop region of the first conductivity type, arranged between the substrate and the epitaxial layer.

According to another embodiment, the substrate has the second conductivity type and is adjacent to the epitaxial layer), or has the first conductivity type and an intermediate epitaxial layer of the second conductivity type extends between the substrate and the epitaxial layer of the first conductivity type.

According to another embodiment, the substrate, the sinker region, the body region, the source region, and the gate region form a first MOS transistor and the body accommodates a second MOS transistor arranged alongside the first MOS transistor, wherein the substrate forms a common source region for the first and second MOS transistors.

According to another embodiment, the integrated power MOSFET device comprises a first and a second edge regions, of the second conductivity type, extending in the epitaxial layer from the first surface towards the substrate and surrounding a first, respectively a second active areas, which accommodate the first, respectively the second MOS transistor, wherein a first and a second polysilicon regions extend on the first surface, above the first, respectively the second edge region and are connected to a respective edge metallization.

According to another embodiment, the integrated power MOSFET device comprises a first gate metallization and a second gate metallizations, extending over the first surface and electrically connected to the first, respectively the second edge metallization; and a first and a second drain metallizations, extending over the first surface and surrounded by the first, respectively the second edge metallizations.

According to another embodiment, there is provided a process for manufacturing an integrated power MOSFET device, comprises the steps of forming a substrate of semiconductor material, forming, on the substrate, an epitaxial layer of a first conductivity type and a first surface, the substrate defining a second surface, forming a sinker region of a second conductivity type extending through the epitaxial layer from the first surface, forming a body region, of the second conductivity type, within the sinker region, forming, within the body region and facing the first surface, a source region of the first conductivity type, and a channel region laterally delimited by the source region, forming a gate region on top of, and electrically insulated from, the first surface, above the channel region, forming a source contact on the first surface, electrically connected to the body region and to the source region and a drain contact on the first surface, electrically connected to the epitaxial layer; and forming a source metallization region on the second surface, electrically connected to the substrate.

According to another embodiment, the process for manufacturing an integrated power MOSFET device further comprising the steps of forming a trench from the first surface through the body region and the sinker region, as far as the substrate; and filling the trench with metal material in electrical contact with the substrate and with the source electrode.

According to another embodiment, the step of forming a sinker region comprises simultaneously forming also an edge region of the second conductivity type, extending from the first surface through the epitaxial layer towards the substrate, the edge region delimiting an active area in the epitaxial layer that accommodates the sinker region, the body region and the source region.

According to another embodiment, the step of forming a gate region comprises simultaneously forming also a semiconductor material region on, and electrically insulated from, the first surface, above the edge region.

According to another embodiment, the process for manufacturing an integrated power MOSFET device further comprises forming simultaneously, an edge metallization on, and electrically connected to, the semiconductor material region, a gate metallization, on the first surface and electrically connected to the edge metallization; and a drain metallization, extending over the entire active area, laterally with respect to the gate metallization.

According to another embodiment, the steps of forming an epitaxial layer and a sinker region comprise, forming a first epitaxial layer of the first conductivity type, selectively introducing first dopant species of the second conductivity type into the first epitaxial layer, forming a second epitaxial layer of the first conductivity type on the first epitaxial layer, selectively introducing second dopant species of the second conductivity type into the second epitaxial layer vertically aligned to the first dopant species; and diffusing the first and second dopant species to form the sinker region.

According to another embodiment, the integrated power MOSFET device is included in a common source power electronic device.

According to another embodiment, the common source power electronic device as described above, which forms one chosen from an LLC resonant converter, a motor control device, and a device for driving inductive loads.

BRIEF DESCRIPTION OF THE DRAWING

For a better understanding of the present invention preferred embodiments thereof are now described, purely by way of non-limiting example, with reference to the attached drawings, wherein.

DETAILED DESCRIPTION

Figure 1:
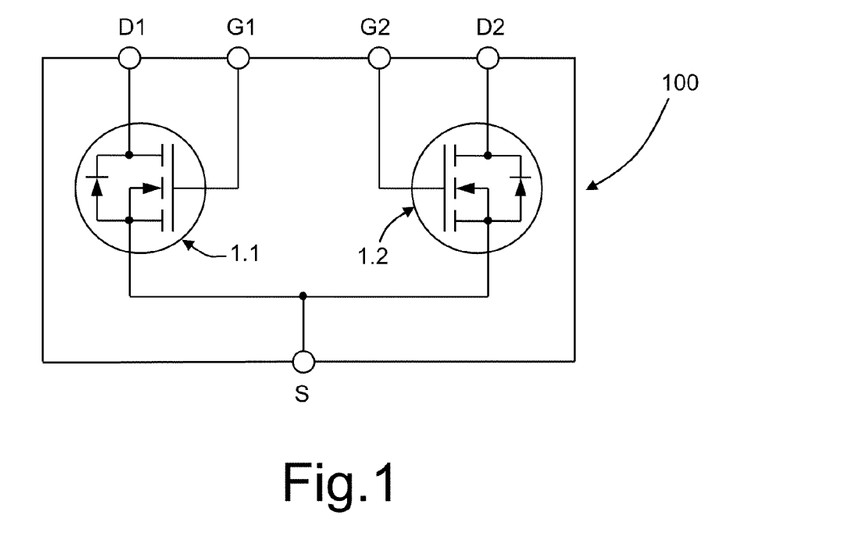
FIG. 1 is an integration circuit diagram of two common-source MOS devices integrated in a single chip.

FIG. 1 shows a chip 100 of semiconductor material that integrates two common-source MOSFETs 1.1 and 1.2. In particular, each MOSFET 1.1, 1.2 has own gate terminals G1, G2 and own drain terminals D1, D2. In addition, the MOSFETs 1.1 and 1.2 have a common source region connected to a common source terminal S.

Figure 2:
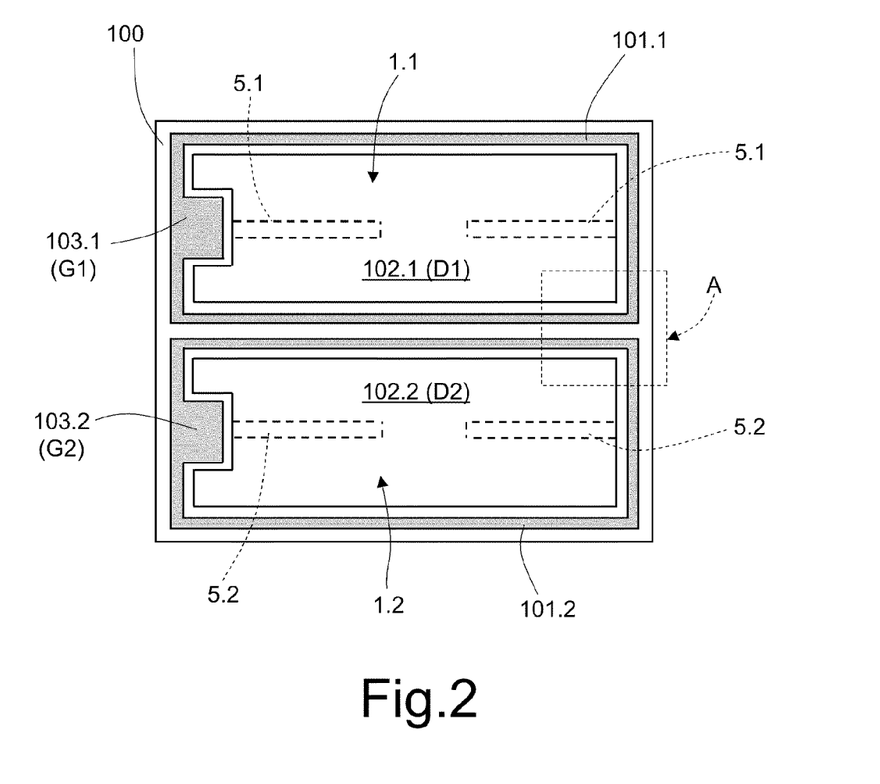
FIG. 2 shows the integration layout of the two MOS devices of FIG. 1.

In the embodiment of FIG. 2, the two MOSFETs 1.1, 1.2 are provided side by side. Two edge metallizations 101.1, 101.2 surround a respective MOSFET 1.1, 1.2 and are electrically connected to respective gate metallizations 103.1, 103.2 (that form the gate terminals G1, G2). FIG. 2 moreover shows drain metallization regions 102.1, 102.2 (that form the drain terminals D1, D2) surrounded by gate metallization regions 103.1, 103.2. As may be noted, the drain metallization regions 102.1, 102.2 stretch for practically the entire area of the top surface of the chip 100 (except for the edge metallization 101.1, 101.2 and gate metallization 103.1, 103.2) and can be contacted via multiwire or with the "clip" or "ribbon" technique.

In addition, FIG. 2 shows schematically, with a dashed line, pairs of gate fingers 5.1, 5.2 of the MOSFETs 1.1, 1.2, which are connected to the respective gate metallizations 103.1, 103.2 and extend underneath the drain metallization 102.1, 102.2, electrically insulated from this by insulation regions. The gate fingers 5.1, 5.2 can be provided in order to reduce the gate resistance and are formed by polysilicon buses that extend longitudinally with respect to each device (horizontally in FIG. 2), starting from a respective gate metallization 103.1, 103.2 and from the edge metallization 101.1, 101.2 on the opposite side with respect to the gate metallization. Alternatively, the two gate fingers 5.1, 5.2 of each MOSFET 1.1, 1.2 can be replaced by a single finger, which extends longitudinally from a respective gate metallization 103.1, 103.2 as far as the edge metallization 101.1, 101.2 opposite thereto.

In FIG. 2 the common source metallization region corresponding to the common source terminal S is not visible, since it is formed on the back of the chip.

Figure 3:
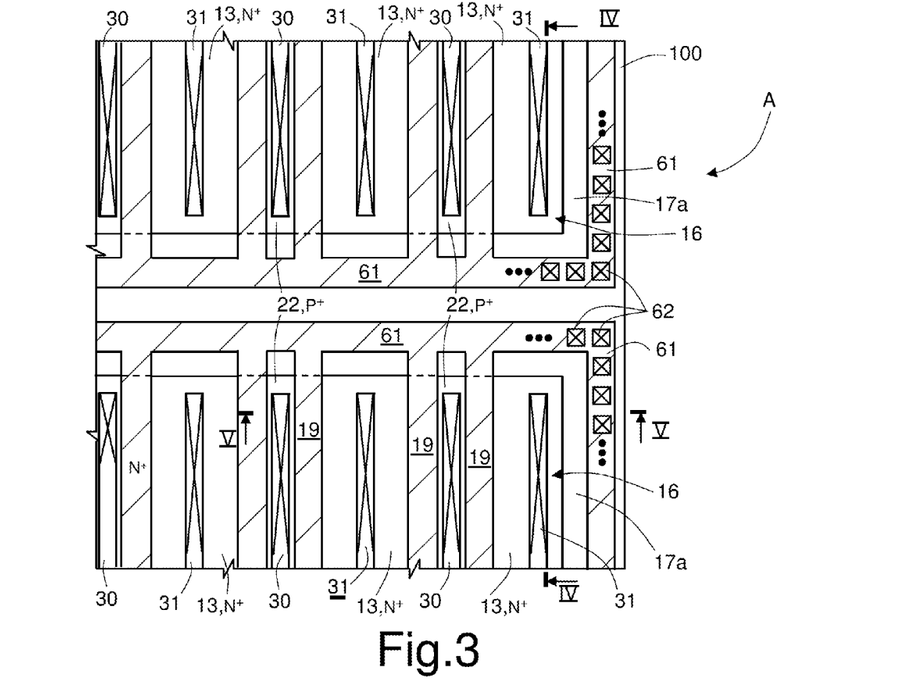
FIG. 3 shows the region A of FIG. 2, at an enlarged scale and with parts removed for sake of clarity.

FIG. 3 shows the layout of a portion of the chip 100 in the proximity of the edge area, underneath the metallizations 101-103 (which are not represented, for sake of clarity) and will be described with initial reference to FIGS. 4 and 5, which are cross-sections taken along the planes IV-IV and V-V, orthogonal to one another. In these figures, as in the subsequent ones, reference will be made to a single MOSFET, designated as a whole by 1, since the transistors 1.1 and 1.2 are the same as one another, as likewise the regions that form MOSFETs 1 are indicated without distinguishing to which of the MOSFETs 1 they belong.

In detail, the chip 100 comprises a body 110 of semiconductor material having a top surface 110a and a bottom surface 110b and formed by a substrate 10, here of P type, for example doped with boron, and by an epitaxial layer 13, of N type. A source metallization 104 extends on the back of the body 110, over the entire bottom surface 110b, and forms the common source terminal S of FIG. 1.

A stop layer 12, of N+ type, extend between the substrate 10 and the epitaxial layer 13 and has the purpose of preventing rising of dopant atoms of P type into the epitaxial layer during the thermal steps of the manufacturing process.

Sinker regions 17a, 17b, here of P type, extend throughout the thickness of the epitaxial layer 13, from the top surface 110a as far as the substrate 10. In particular, an edge sinker region 17a extends in the edge area of each MOSFET 1 and delimits a respective active area 16 (FIG. 4), and source sinker regions 17b extend within the active areas 16, in a transverse direction with respect to each MOSFET 1 (FIG. 3). The sinker regions 17a, 17b traverse the stop layer 12 and penetrate partially into the substrate 10 so as to electrically connect the top surface 110a with the substrate 10. The source sinker regions 17b in the active areas 16 each accommodate a respective body region 22, of P+ type. Each of the body regions 22 in turn accommodates two source regions 25, of N type. In practice, in a known way for lateral MOSFET devices, the epitaxial layer 13 forms the drain region of the MOSFET 1, and the portions 22a of the body region 22 arranged between the source regions 25 and the epitaxial layer 13 form channel regions.

The epitaxial layer 13 moreover accommodates drain contact regions 26, of N+ type, arranged laterally at a distance and on both sides of the source sinker regions 17b (FIG. 3).

Extending on the top surface 110a, above each active area 16, is a gate oxide layer 18. Polysilicon gate regions 19 each overlie a respective channel region 22a. Field plate regions 21 surround the gate regions 19, at least at the top and on one side, opposite with respect to the channel regions 22a.

A dielectric layer 28, for example of BPSG (Boron Phosphorous Silicon Glass) covers the field plate regions 21 and laterally surrounds source contacts 30 and drain contacts 31. The source contacts 30 extend between adjacent pairs of the gate regions 19, insulated with respect to these by the dielectric layer 28, through the gate oxide layer 18, as far as the top surface 110a of the body 110, in direct electrical contact with the body regions 22 and the source regions 25 so as to maintain them at the same potential. Likewise, the drain contacts 31 extend through the dielectric layer 28, the field plate regions 21, and the gate oxide layer 18, as far as the drain contact regions 26.

In the edge area of each MOSFET 1, a thick oxide region 60 extends over the edge sinker region 17a, and a polysilicon region 61 formed in the same layer and electrically connected to the gate regions 19 extends over the region 17a (FIG. 3). The dielectric layer 28 covers and insulates the polysilicon region 61, except at gate contacts 62 (FIGS. 3 and 5) formed in the first metallization level.

A passivating layer 32 covers at the top the entire structure and is open at vias 33, 63 where the drain metallization 102 and edge metallization 101 are in contact with the drain contact 31 and gate contact 62.

Figure 4:
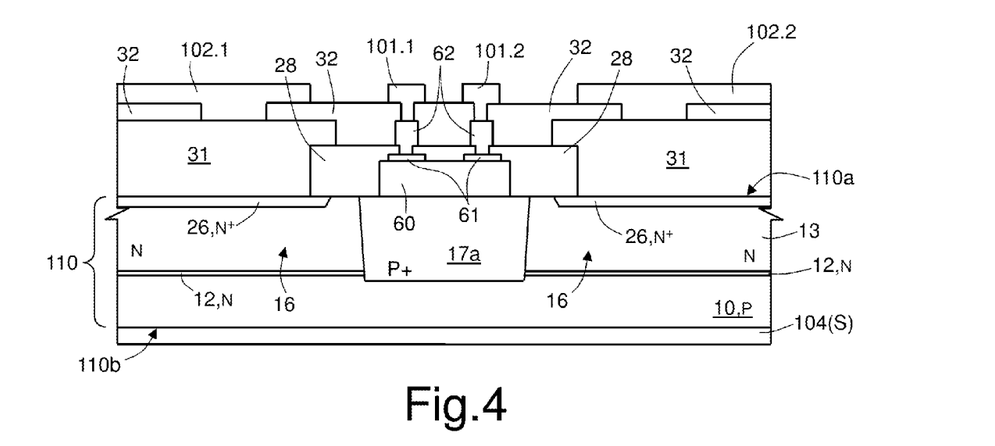
FIG. 4 shows a cross-section, taken along section plane IV-IV of FIG. 3.
Figure 5:
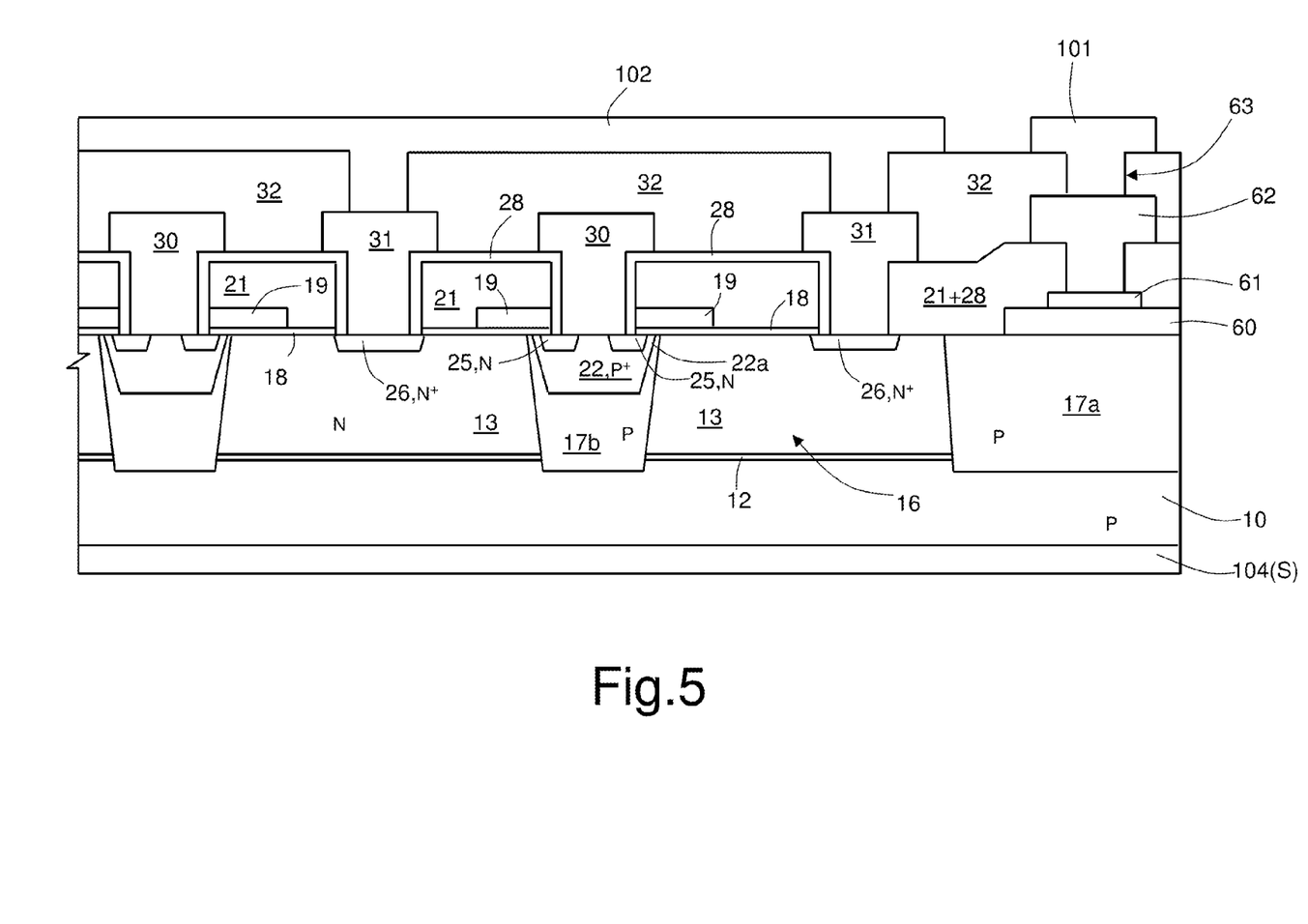
FIG. 5 shows a cross-section, taken along section plane V-V of FIG. 3.
Figure 6:
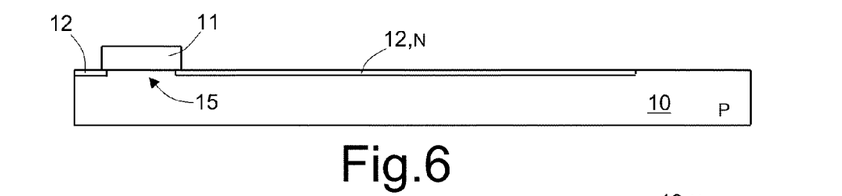
FIGS. 6-15 show cross-sections similar to that of FIG. 5, in successive manufacturing steps.

In the device of FIGS. 3-5, the source metallization 104 enables biasing of the source regions 25 and of the body regions 22 from the back, through the substrate 10 and the source sinker regions 17b.

If the MOSFETs 1 of FIGS. 3-5 have gate fingers 5, as illustrated with a dashed line in FIG. 2, these extend in a transverse direction with respect to the gate regions 19, on a thick oxide layer, and are connected to intermediate points of the gate regions 19.

The MOSFET 1 of FIGS. 3-5 is obtained as described hereinafter with reference to FIGS. 6-15.

The process starts with the substrate 10, doped with boron, having a resistivity of for example 1-3 mΩ·cm. Using a first mask 11, the substrate 10 is implanted with dopant species of N type, such as, for example, phosphorus. The implant is carried out, for example, at a dose of $1\times10^{14}$-$3\times10^{15}$ atoms/cm$^2$ with an implantation energy of 50-100 keV, to form the stop layer 12 (FIG. 6), having non-implanted areas 15.

Figure 7:
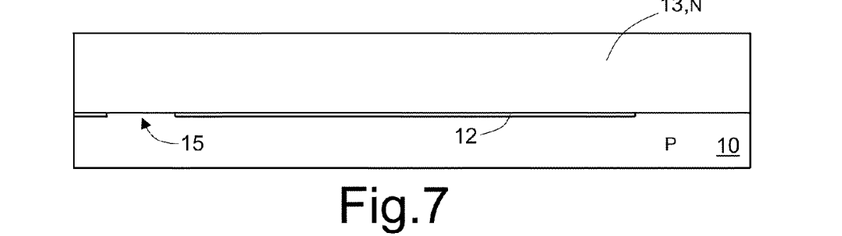
Figure 8:
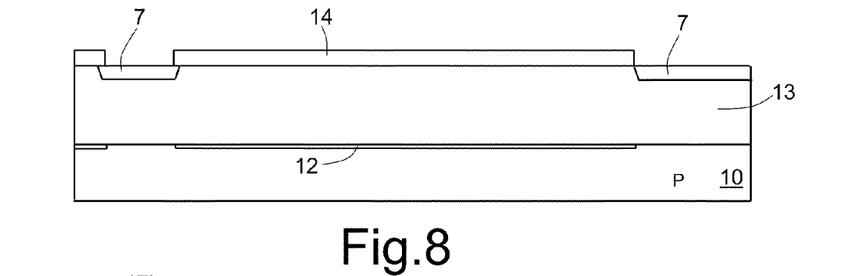

After removal of the first mask 11, an epitaxial growth of N type is made to form the epitaxial layer 13 having a resistivity of for example 0.2-3Ω·cm and a thickness of 2-4 μm (FIG. 7).

Figure 9:
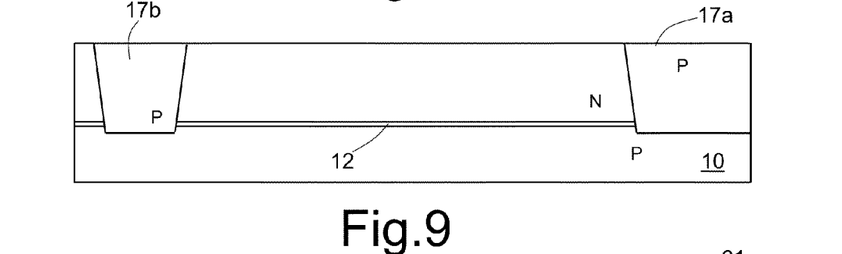

Next, a sinker mask 14 is provided, having windows approximately aligned to the non-implanted areas 15. Then (FIG. 8), dopant species of P type, such as boron, are implanted, for example at a dose of $1\times10^{14}$-$3\times10^{15}$ atoms/cm$^2$ and with an implantation energy of 50-200 keV. Thereby, thin layers 7 are formed and, after removal of the sinker mask 14, and a thermal step, diffuse throughout the thickness of the epitaxial layer 13 and form the sinker regions 17a and 17b in direct contact with the substrate 10 (FIG. 9).

Figure 10:
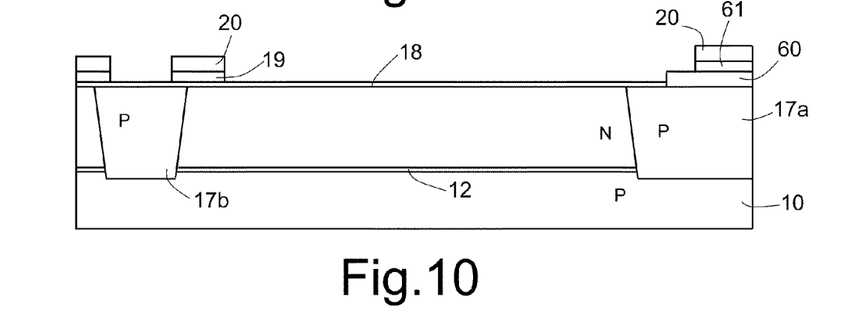

Next, the thick oxide regions 60 are formed in the edge areas (and, if envisaged, in a transverse direction with respect to each MOSFET 1, underneath the gate fingers 5 of FIG. 2), via vapox deposition of approximately 50 nm and selective etching, and the steps for obtaining the MOSFETs 1 are carried out, which include deposition of the gate oxide layer 18, deposition of a polysilicon layer doped in situ or doped with an implantation of N type, and formation of a resist gate mask 20. Using the gate mask 20, the polysilicon layer is selectively removed to define the gate regions or electrodes 19, and the polysilicon regions 61 (FIG. 10). If envisaged, the gate fingers 5, not visible in FIG. 10, are also defined in this step.

Figure 11:
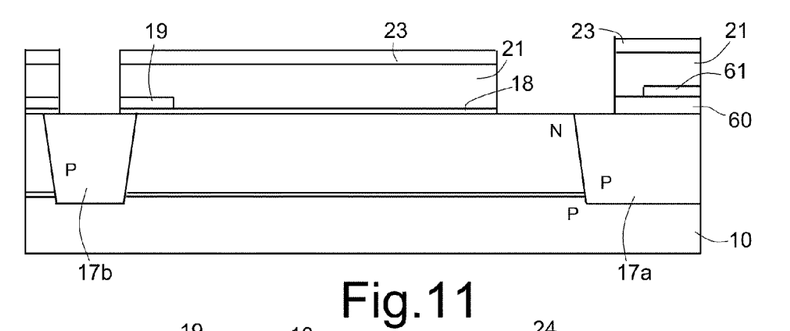

After removal of the gate mask 20 and through a field plate mask 23, a field plate layer, for example, of silicon oxide, is deposited and then shaped so as to form the field plate regions 21. Using the field plate mask 23, the gate oxide layer 18 is moreover selectively removed on the source sinker regions 17b, where the drain contact regions are to be provided, and on the edge area (FIG. 11).

Figure 12:
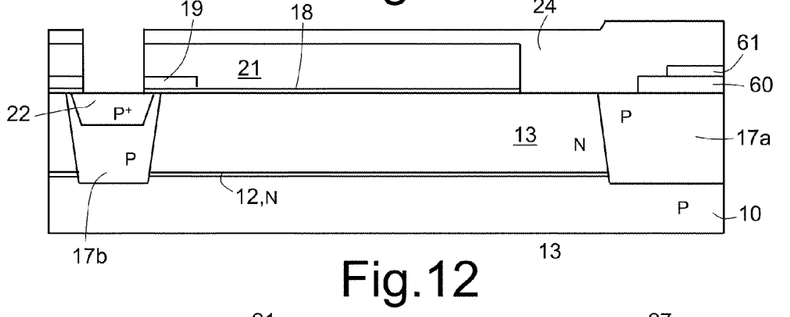
Figure 13:
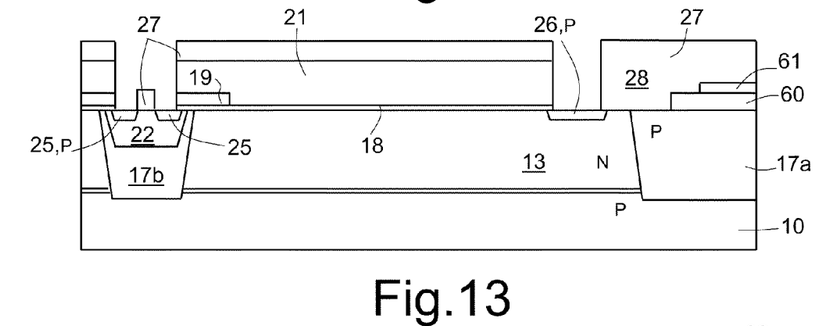
Figure 14:
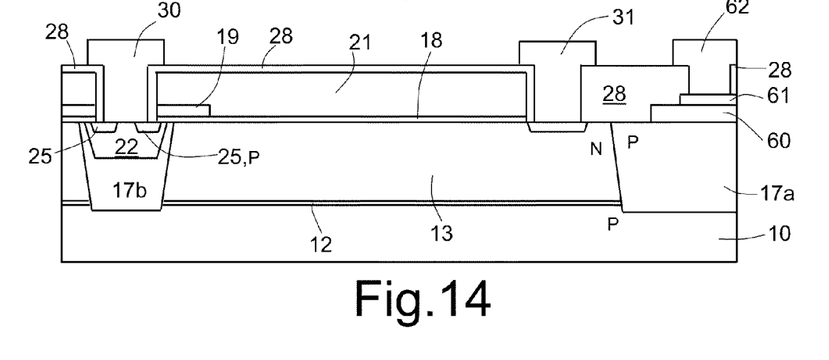

In addition, using a resist body mask 24, for example with a dose of $1\times10^{13}$-$2\times10^{14}$ atoms/cm$^2$ and an energy of 60-100 keV, dopant species of P type are implanted, for example boron, which, after removal of the body mask 24 and a thermal activation and diffusion step, form the body regions 22 within the source sinker regions 17b (FIG. 12).

Next, a junction mask 27 is provided, and dopant species of N type are implanted, for example arsenic with a dose of, for example, $10^{15}$-$10^{16}$ atoms/cm$^2$ and energy of 30-60 keV. Consequently (FIG. 13), after removal of the junction mask 27 and a thermal activation and diffusion step, the source regions 25 are formed within the body regions 22, and the drain contact regions 26 are formed within the epitaxial layer 13.

Next (FIG. 14), the dielectric layer 28, for example of BPSG, is deposited, and the contacts towards the source regions 25, the drain contact regions 26, and the polysilicon regions 61 are opened. A first metal layer is deposited and defined so as to form the source contacts 30, the drain contacts 31, and the gate contacts 62.

Then (FIG. 15), the passivating layer 32 is deposited, the vias 33 and 63 are opened, and a second metal layer is deposited and defined so as to form the drain contact regions 102, the edge metallization 101, and the gate metallizations 103. Finally, the source metallization 104 is deposited on the back to obtain the final structure of FIGS. 4 and 5.

Figure 16:
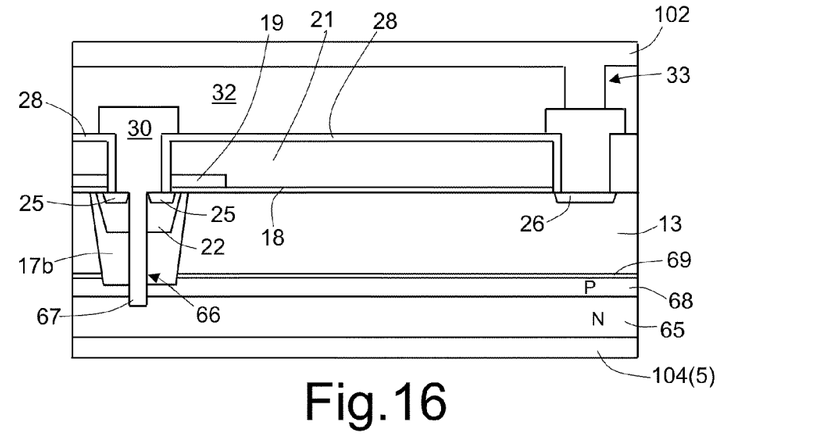
FIG. 16 shows a cross-section of a variant of the MOSFET device of FIG. 5.
Figure 17:
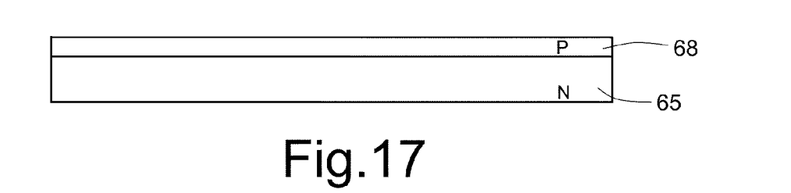
FIGS. 17-23 show cross-sections of the variant of FIG. 16, in successive manufacturing steps.

FIG. 16 shows a cross-section similar to that of FIG. 5 and regarding a different embodiment of the MOSFET 1, obtained starting from a substrate 65 of N type and equipped with trenches 66 that extend from the top surface 110$a$ as far as the substrate 65, traversing the body regions 22 and the edge sinker regions 17$a$, and are filled with metal regions 67. In this case, a first epitaxial layer 68, of P type, extends on the substrate 65 of N and a second epitaxial layer, designated once again by 13 for uniformity of representation, extends thereover.

Obviously, it is possible to obtain devices having just one of the two different characteristics, for example equipped with a substrate 65 of N type and a first epitaxial layer 68 of P type arranged between the substrate 65 and the second epitaxial layer 13 without trenches 66 (wherein the sinker regions 17$a$, 17$b$ terminate in direct contact with the substrate 65) or to obtain the trenches 66 starting from a substrate 10 of P type, as in FIG. 3.

The MOSFET 1 of FIG. 16 is obtained as described hereinafter with reference to FIGS. 17-23, wherein, for simplicity, the edge structures have not been represented, formation whereof being on the other hand identical to the one described with reference to FIGS. 6-14.

Initially (FIG. 17), the second epitaxial layer 68, of P type, for example with a thickness of 2-4 µm and a resistivity of 0.2-3Ω·cm, is grown on the substrate 65 of N type, doped with arsenic and having a conductivity of, for example, 1-3 mΩ·cm.

Figure 18:
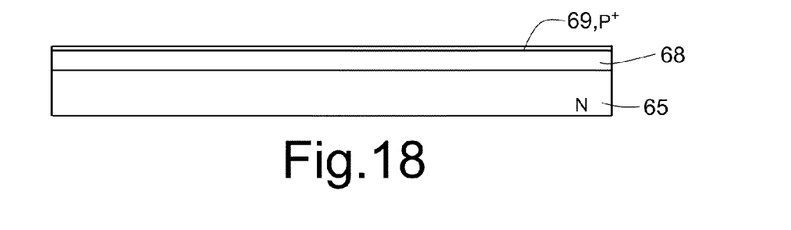

Then (FIG. 18), the second epitaxial layer 68 is implanted with dopant species of P type, such as, for example, boron, for enrichment of the surface. The implantation is carried out, for example, at a dose of $1\times10^{14}$-$3\times10^{15}$ atoms/cm$^2$ with an implantation energy of 50-100 keV, to form a stop layer 69 (FIG. 18).

Figure 19:
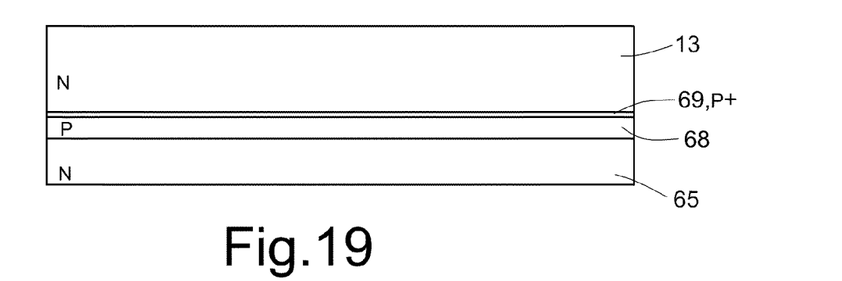
Figure 20:
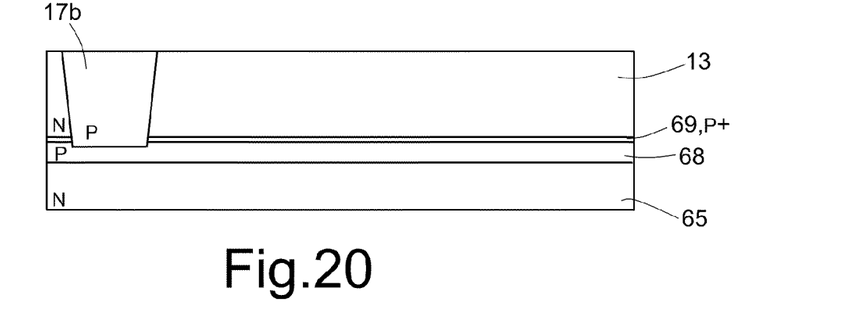

Next, a further epitaxial growth of N type is carried out to form the first epitaxial layer 13 having a resistivity of, for example, 0.2-3Ω·cm and a thickness of 2-4 µm (FIG. 19). Then, in a way similar to what has been described with reference to FIGS. 8 and 9, the sinker mask 14 is formed having windows where it is desired to obtain the sinker regions 17$a$, 17$b$, and an implantation of dopant species of P type, such as boron, is carried out for example at a dose of $1\times10^{14}$-$3\times10^{15}$ atoms/cm$^2$ and with an implantation energy of 50-200 keV. In this way, thin layers are formed, which, after removal of the sinker mask 14, and a thermal step, form the sinker regions 17$a$ and 17$b$ (the latter are not visible in FIG. 20) in direct contact with the substrate 65. Also in this case, the sinker regions 17$a$ and 17$b$ completely traverse the first epitaxial layer 13 and the stop layer 69. In addition, they extend throughout a fair part of the thickness of the second epitaxial layer 68, as far as into the proximity of the substrate 65. For example, the sinker regions 17$a$ and 17$b$ extend for a total depth of 4-9 µm.

Figure 21:
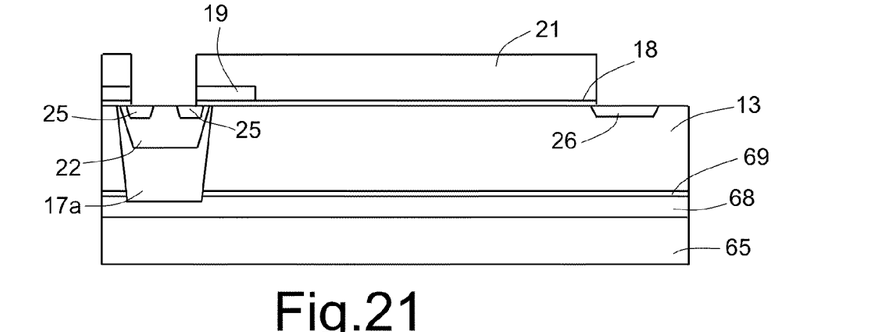
Figure 22:
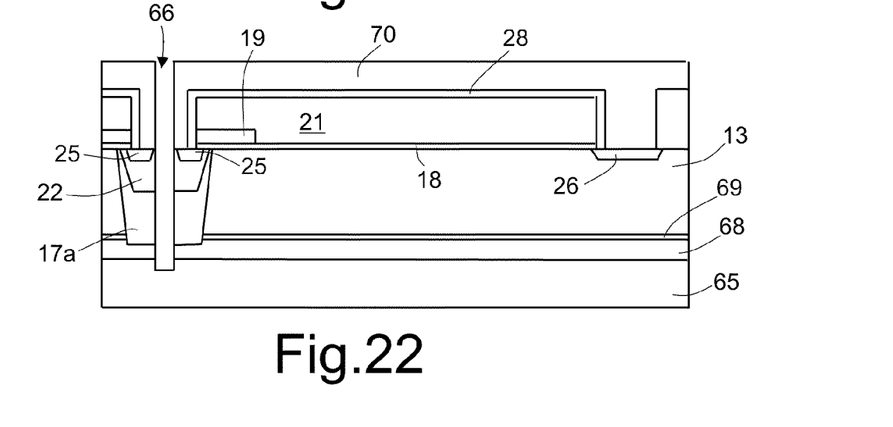

Then, the steps already described with reference to FIGS. 10-14 follow and include: forming the thick oxide regions 60; depositing the gate oxide layer 18; forming the gate regions 19 and the polysilicon regions 61; forming the field plate regions 21; selectively removing the gate oxide layer 18; forming the body regions 22; and forming the source regions 25 and the drain contact regions 26 to obtain the structure of FIG. 21.

Next (FIG. 22), the dielectric layer 28 is deposited and is removed where the source, drain, and gate contacts are to be formed, and, using a trench mask 70, the trenches 66 are made so as to completely traverse the source sinker regions 17$b$ and the second epitaxial layer 68 and to penetrate into the substrate 65. For example, the total depth of the trenches 66 within the body 110 may be 4-9 µm.

Figure 23:
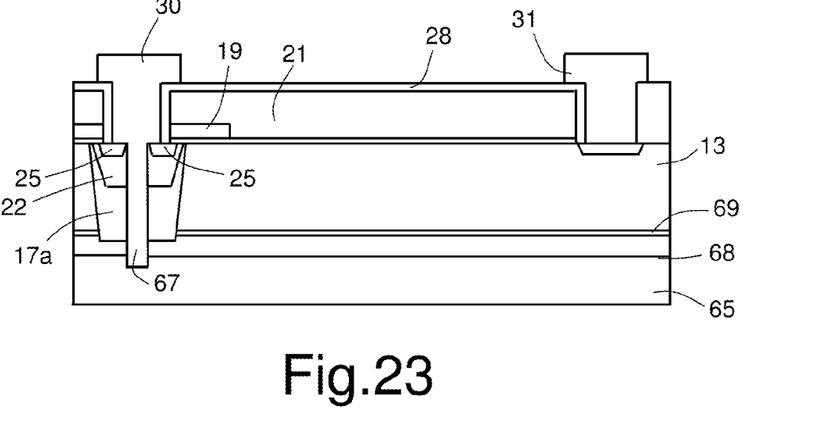

After removing the trench mask 70, the first metallization is deposited and fills the trenches 66 to form the metal regions 67, the source contacts 30, the drain contacts 31, and the gate contacts 62 (not shown) (FIG. 23).

Figure 15:
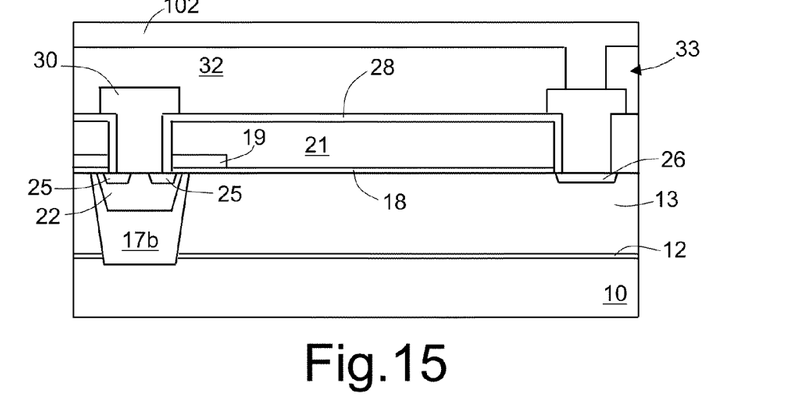

Next, in a way similar to what has been described with reference to FIG. 15, the passivating layer 32 is deposited, the vias 33 and 63 are opened, a second metal layer is deposited and defined so as to form the metallizations 101-103, and the source metallization 104 is deposited on the back to obtain the final structure of FIG. 16.

Figure 24:
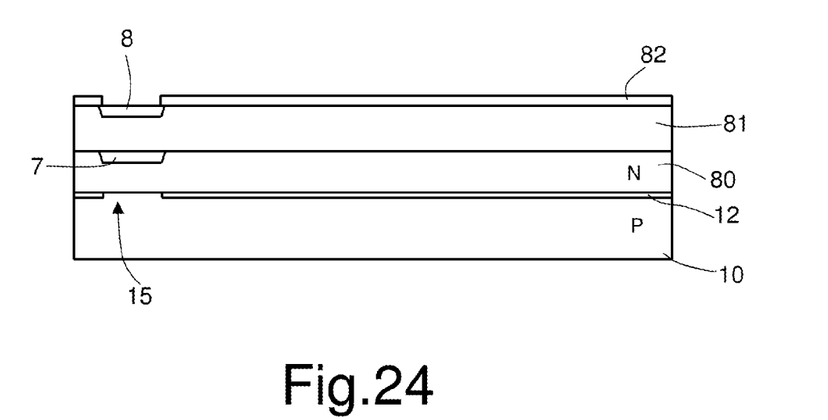
FIGS. 24, 25 show cross-sections of a different variant of the device of FIG. 5, in two successive manufacturing steps.
Figure 25:
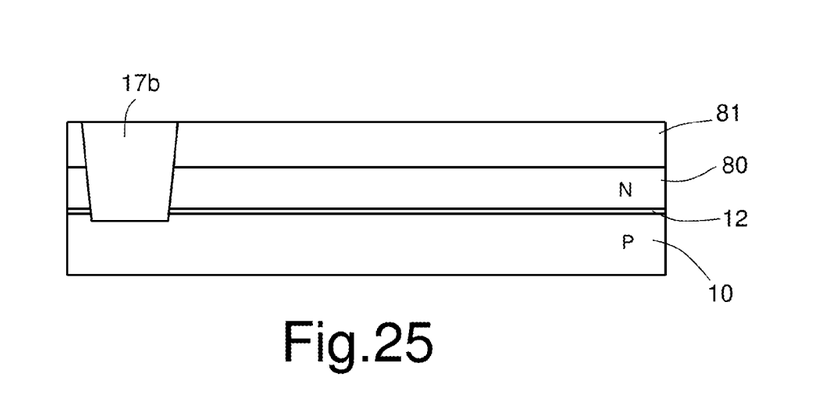

According to a different embodiment, the sinker regions 17$a$, 17$b$ can be provided using repeated epitaxial growths, each followed by a corresponding implantation of dopant species, as illustrated in FIGS. 24 and 25.

In this case, the process starts from the substrate 10 of P type, doped with boron, having a resistivity of, for example, 1-3 mΩ·cm. Then dopant species of N type are implanted, such as, for example, phosphorus, for instance at a dose of $1\times10^{14}$-$3\times10^{15}$ atoms/cm$^2$ with an implantation energy of 50-100 keV, so as to form the stop layer 12 having non-implanted areas 15.

Then a first epitaxial growth of N type is carried out to form a first epitaxial layer 80, having a resistivity of, for example, 0.2-10Ω·cm and a thickness of 2-4 µm. Then, using a sinker mask (not illustrated) having windows approximately aligned to the non-implanted areas 15, a first implantation of dopant species of P type, such as boron, is carried out for example at a dose of $1\times10^{14}$-$3\times10^{15}$ atoms/cm$^2$ and with an implantation energy of 50-200 keV to form first thin layers 7. This is followed by a second epitaxial growth of N type to form a second epitaxial layer 81, having the same characteristics as the first epitaxial layer 80, and, via a sinker mask 82 having windows approximately aligned to the first thin layers 7, a second implantation of dopant species of P type is carried out with the same characteristics as the first implantation to obtain second thin layers 8, aligned to the first thin layers 7, thus obtaining the structure of FIG. 24.

The steps of epitaxial growth and implantation of thin layers of P type, vertically aligned to one another, can be repeated a number of times, until the desired final thickness for the body 110 is reached.

At the end, after removing the last sinker mask and a thermal step, the various implanted thin layers 7, 8, . . . diffuse throughout the thickness of the epitaxial multilayer and form the sinker regions 17$a$ and 17$b$, as illustrated, for example, in FIG. 25. The process then proceeds with the steps of the first embodiment, described with reference to FIGS. 10-15 or with the steps of the second embodiment, described with reference to FIGS. 21-23.

The same process can be carried out in the case of a substrate of N type, as in the embodiment of FIGS. 17-20.

The MOSFET device described can be advantageously used in a LCC synchronous resonant converter of the type illustrated in FIGS. 26-29 or in other power switching converters. In addition, arrays of common source MOSFETs of the type described can be used in applications for motor control and for driving inductive loads in industrial environment.

The MOSFET described herein has numerous advantages. First, it enables arrangement of the source terminal on the back of the device. Consequently, it is possible to integrate an array of common source MOSFETs in a single die that can then be mounted on a standard frame with single island. There follow evident advantages in terms of cost and simplicity of assemblage.

Formation of the source contact on the back enables reduction of the dispersed inductances, thus preventing, during operation, areas of the device from going into a subground condition, i.e., at potentials lower than the substrate.

As compared to currently known lateral devices, such as, for example, LDMOSs, which are commonly used at high frequencies (of the order of gigahertz), but which have high power dissipations so that they cannot be used for high power applications, it is possible to drastically reduce the losses. This is all the more necessary if the different operation mode of the power devices as compared to known lateral devices is taken into account. In fact, the latter are generally used in conditions of conduction modulation and are rarely turned off during operation of the system wherein they are inserted. Instead, power devices are generally used in on/off mode so that it is necessary to avoid losses during the off condition, which, taking into account the high currents involved, would lead to leakage currents of a high absolute value, heating, and malfunctioning.

The embodiment that includes trenches 61 filled with metal material 62 enables reduction of the resistance of the source sinker regions 17b, thus obtaining a RDS(on) much lower as compared to other solutions, at the expense of an additional digging step.

The embodiment that uses an epitaxial multilayer and successive steps of implantation of dopant species to form the sinker regions 17a, 17b enables high breakdown levels to be achieved, in particular when it is desirable to have a very thick epitaxial layer, eliminating the limitations of single epitaxial layer solutions, where the implantation energies commonly used are unable to guarantee a sufficient diffusion of the sinker region.

In the case of integration in a synchronous rectifier, the reduction of the parasitic capacitance, for a same RDS(on), enables reduction of the energy used for driving the gate terminals, as well as the losses of power associated to charging and discharging of the parasitic capacitances. There follows an increase in the efficiency of conversion over a wider range of charging currents for the converter.

In addition, there is a significant shift downwards of the charging threshold below which the use of synchronous rectifiers is no longer convenient since the driving losses and the parasitic elements (which tend to increase as the charge of the converter decreases) exceed the saving on the conduction losses (which tend to zero as the charge decreases).

Finally, it is clear that modifications and variations may be made to the MOSFET device and to the corresponding manufacturing process, described and illustrated herein, without thereby departing from the scope of the present invention, as defined in the attached claims.

For example, even though the solutions illustrated show metal contact source regions only on the back of the chip, it is possible to obtain source contacts also on the front, if so desired.

The MOSFET 1 may or may not have the gate fingers 5 illustrated in FIG. 2, and the gate fingers may be more than one for each device and/or extend throughout the length without being interrupted at the centre, as shown, on the basis of the levels of performance and electrical characteristics required.

Even though in the above description reference has been made to processes with two metallization levels, it is possible to use also processes with a single metallization level or with a number of metallization levels.

Finally, the conductivity type of the semiconductor regions that form the MOSFET can be reversed with respect to what has been shown, as is evident to a person skilled in the art.

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:

1. An integrated power MOSFET device, comprising:
   a substrate;
   an epitaxial layer of a first conductivity type, the epitaxial layer and the substrate defining a first surface and a second surface, respectively;
   a sinker region of a second conductivity type, extending through the epitaxial layer from the first surface and in electrical contact with the substrate;
   a body region of the second conductivity type, extending within the sinker region from the first surface;
   a source region of the first conductivity type, extending within the body region from the first surface, the source region delimiting a channel region within the body region and facing the first surface;
   a gate region, extending over, and electrically insulated from, the first surface, above the channel region;
   a source contact, extending over the first surface and electrically connected to the body region and to the source region;
   a drain contact, extending over the first surface and electrically connected to the epitaxial layer; and
   a source metallization region, extending over the second surface and electrically connected to the substrate.

2. The device according to claim 1, wherein the sinker region extends as far as the substrate.

3. The device according to claim 1, comprising a trench extending from the first surface through the body region, the sinker region and part of the substrate, the trench being filled with metal material in direct electrical contact with the substrate and with the source electrode.

4. The device according to claim 1, comprising an edge structure including an edge region, of the second conductivity type, extending through the epitaxial layer from the first surface and in electrical contact with the substrate, the edge region delimiting an active area in the epitaxial layer housing the sinker region, the body region, and the source region.

5. The device according to claim 4, wherein the edge structure further comprises a semiconductor material region extending over, and electrically insulated from, the first surface, above the edge region, and an edge metallization extending over, and electrically connected to, the semiconductor material region, the device further comprising a gate metallization, extending over the first surface and electrically connected to the edge metallization, and a drain metallization, extending over the first surface on the entire active area, except at the gate metallization.

6. The device according to claim 5, wherein the gate region comprises at least one polysilicon line extending on the first surface from a first side of the semiconductor material region.

7. The device according to claim 6, wherein the gate region further comprises a gate finger extending on the first surface from a second side of the semiconductor material region, in a transverse direction with respect to the polysilicon line.

8. The device according to claim 1, comprising a stop region of the first conductivity type, arranged between the substrate and the epitaxial layer.

9. The device according to claim 1, wherein the substrate has the second conductivity type and is adjacent to the epitaxial layer, or has the first conductivity type and an intermediate epitaxial layer of the second conductivity type extends between the substrate and the epitaxial layer of the first conductivity type.

10. The device according to claim 1, wherein the substrate, the sinker region, the body region, the source region, and the gate region form a first MOS transistor and the body accommodates a second MOS transistor arranged alongside the first MOS transistor, wherein the substrate forms a common source region for the first and second MOS transistors.

11. The device according to claim 10, comprising a first and a second edge regions, of the second conductivity type, extending in the epitaxial layer from the first surface towards the substrate and surrounding a first, respectively a second active areas, which accommodate the first, respectively the second MOS transistor, wherein a first and a second polysilicon regions extend on the first surface, above the first, respectively the second edge region and are connected to a respective edge metallization.

12. The device according to claim 11, comprising a first gate metallization and a second gate metallization, extending over the first surface and electrically connected to the first, respectively the second edge metallization; and a first and a second drain metallizations, extending over the first surface and surrounded by the first, respectively the second edge metallizations.

13. A process for manufacturing an integrated power MOSFET device, comprising the steps of:
   forming a substrate of semiconductor material;
   forming, on the substrate, an epitaxial layer of a first conductivity type and a first surface, the substrate defining a second surface;
   forming a sinker region of a second conductivity type extending through the epitaxial layer from the first surface;
   forming a body region, of the second conductivity type, within the sinker region;
   forming, within the body region and facing the first surface, a source region of the first conductivity type, and a channel region laterally delimited by the source region;
   forming a gate region on top of, and electrically insulated from, the first surface, above the channel region;
   forming a source contact on the first surface, electrically connected to the body region and to the source region and a drain contact on the first surface, electrically connected to the epitaxial layer; and
   forming a source metallization region on the second surface, electrically connected to the substrate.

14. The process according to claim 13, further comprising the steps of:
   forming a trench from the first surface through the body region and the sinker region, as far as the substrate; and
   filling the trench with metal material in electrical contact with the substrate and with the source electrode.

15. The process according to claim 13, wherein the step of forming a sinker region comprises simultaneously forming also an edge region of the second conductivity type, extending from the first surface through the epitaxial layer towards the substrate, the edge region delimiting an active area in the epitaxial layer that accommodates the sinker region, the body region and the source region.

16. The process according to claim 15, wherein the step of forming a gate region comprises simultaneously forming also a semiconductor material region on, and electrically insulated from, the first surface, above the edge region.

17. The process according to claim 16, further comprising forming simultaneously:
   an edge metallization on, and electrically connected to, the semiconductor material region;
   a gate metallization, on the first surface and electrically connected to the edge metallization;
   a drain metallization, extending over the entire active area, laterally with respect to the gate metallization.

18. The process according to claim 13, wherein the steps of forming an epitaxial layer and a sinker region comprise:
   forming a first epitaxial layer of the first conductivity type;
   selectively introducing first dopant species of the second conductivity type into the first epitaxial layer;
   forming a second epitaxial layer of the first conductivity type on the first epitaxial layer;
   selectively introducing second dopant species of the second conductivity type into the second epitaxial layer vertically aligned to the first dopant species; and
   diffusing the first and second dopant species to form the sinker region.

19. A common source power electronic device, comprising the integrated power MOSFET device according to claim 1.

20. The common source power electronic device according to claim 19, which forms one chosen from an LLC resonant converter, a motor control device, and a device for driving inductive loads.

21. The integrated power MOSFET device according to claim 1, wherein the drain contact is in physical contact with the epitaxial layer of the first conductivity type.

22. The integrated power MOSFET device according to claim 1, wherein the gate region extends over, and is electrically insulated from, the epitaxial layer of the first conductivity type.

23. The integrated power MOSFET device according to claim 1, wherein the device is a vertical current type power MOSFET.

24. A device comprising at least a first MOSFET and a second MOSFET formed on a single die, the device comprising:
   an epitaxial layer of a first conductivity type, the epitaxial layer defining a first surface;
   a substrate, wherein the substrate forms a common source for the first MOSFET and the second MOSFET, and wherein the substrate defines a second surface;
   a first drain contact of the first MOSFET;
   a second drain contact of the second MOSFET;
   a first drain metallization extending over the second surface and electrically connected to the first drain contact;
   a second drain metallization extending over the second surface and electrically connected to the second drain contact;
   a first gate contact of the first MOSFET;
   a second gate contact of the second MOSFET;
   a first edge metallization extending over the first surface and electrically connected to the first gate contact, wherein the first edge metallization surrounds, and is electrically insulated from, the first drain metallization; and
   a second edge metallization extending over the first surface and electrically connected to the second gate contact, wherein the second edge metallization surrounds, and is electrically insulated from, the second drain metallization.

25. The device of claim 24, further comprising:
a sinker region of a second conductivity type, extending through the epitaxial layer from the first surface and in electrical contact with the substrate;
a body region of the second conductivity type, extending within the sinker region from the first surface;
a source region of the first conductivity type, extending within the body region from the first surface, the source region delimiting a channel region within the body region and facing the first surface;
a gate region, extending over, and electrically insulated from, the first surface, above the channel region;
a source contact, extending over the first surface and electrically connected to the body region and to the source region;
a drain contact, extending over the first surface and electrically connected to the epitaxial layer; and
a source metallization region, extending over the second surface and electrically connected to the substrate.

* * * * *